US008250391B2

(12) United States Patent
Lee

(10) Patent No.: US 8,250,391 B2
(45) Date of Patent: Aug. 21, 2012

(54) METHOD AND SYSTEM OF IMPROVING MEMORY POWER EFFICIENCY

(75) Inventor: Chun-Liang Lee, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 539 days.

(21) Appl. No.: 12/429,260

(22) Filed: Apr. 24, 2009

(65) Prior Publication Data

US 2010/0164470 A1      Jul. 1, 2010

(30) Foreign Application Priority Data

Dec. 27, 2008   (CN) .......................... 2008 1 0306599

(51) Int. Cl.
   *G06F 1/26*      (2006.01)
   *G06F 13/40*     (2006.01)
(52) U.S. Cl. .................. 713/320; 710/301; 710/302
(58) Field of Classification Search .................... 713/320
   See application file for complete search history.

(56) References Cited

U.S. PATENT DOCUMENTS

| 5,555,510 | A  | * | 9/1996 | Verseput et al. | 710/302 |
| 5,802,328 | A  | * | 9/1998 | Yoshimura | 710/301 |
| 6,289,407 | B1 | * | 9/2001 | Yamada et al. | 710/107 |
| 6,564,278 | B1 | * | 5/2003 | Olson | 710/301 |
| 6,789,149 | B1 | * | 9/2004 | Bhadsavle et al. | 710/302 |
| 2010/0035461 | A1 | * | 2/2010 | Berke | 439/489 |
| 2010/0115179 | A1 | * | 5/2010 | Carr et al. | 711/103 |

OTHER PUBLICATIONS

"Gigabyte GA-EP45T-Extreme DDR3 Motherboard Review"; Hardware Canucks; Aug. 20, 2008; all pages; available online at http://www.hardwarecanucks.com.*

* cited by examiner

*Primary Examiner* — Ryan Stiglic
(74) *Attorney, Agent, or Firm* — Altis Law Group, Inc.

(57) ABSTRACT

A method of improving memory power efficiency is disclosed. The method includes the following steps: a ground pin of a memory socket connecting to a power source, the ground pin is connected to a controller; the ground pin outputting a high level signal to the controller when the memory socket is without a memory component; and the controller sending an off-command to a regulator to cut off a supplying power to the memory socket after the controller receives the high level signal.

20 Claims, 2 Drawing Sheets

METHOD AND SYSTEM OF IMPROVING MEMORY POWER EFFICIENCY

BACKGROUND

1. Technical Field

The present invention relates to a method of improving power efficiency and, particularly, to a method of improving memory power efficiency.

2. Description of Related Art

Computer motherboards include a number RAM memory slots or sockets. Depending on the purpose of the computer, the slots may be fully populated with RAM memory chips, such as dual in-line memory modules (DIMMs), or may not be fully populated. A voltage regulator down (VRD) is used to regulate the voltage to the memory slots down. Most VRDs are designed to perform efficiently when all the slots are populated. However, when the slots are not fully populated, the VRD wastes power.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

Figure 1:
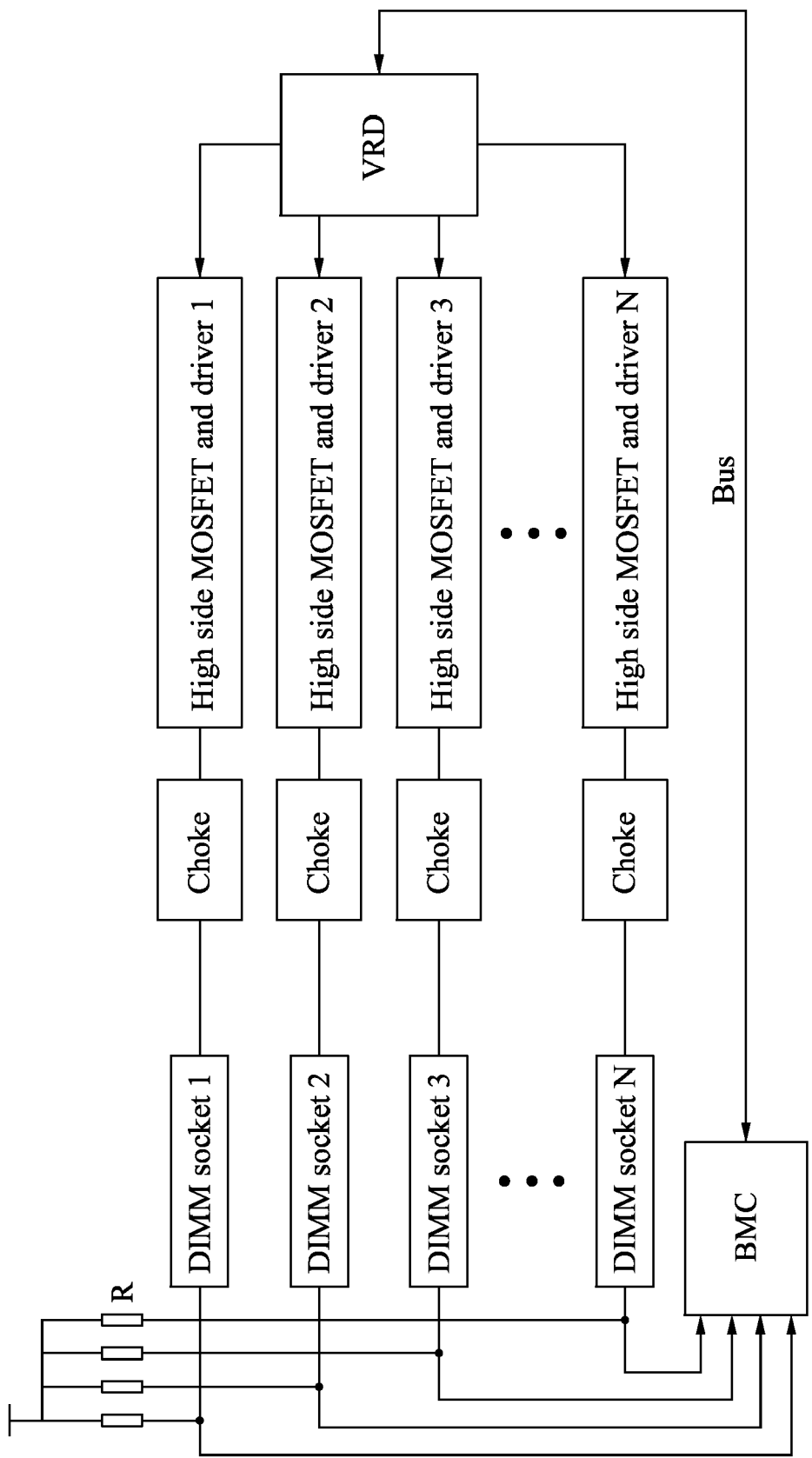
FIG. 1 is a circuit diagram of a method of improving memory power efficiency according to an exemplary embodiment.

Referring to FIG. 1, a method of improving memory power efficiency of the exemplary embodiment includes a VRD, a plurality of DIMM sockets (DIMM socket 1, DIMM socket 2 ..., DIMM socket N), and a baseboard management controller (BMC). The VRD connects with a plurality of switches, such as high side Metal-Oxide-Semiconductor Field-Effect Transistors (MOSFETs) and drivers. Each switch connects to a choke. Each choke connects to one of the DIMM sockets. A ground pin of each DIMM socket is pulled high to power through a resistor, and the ground pins are connected to the BMC. The BMC is connected to the VRD via a system bus, such as an Inter-Integrated Circuit (I2C) bus.

Figure 2:
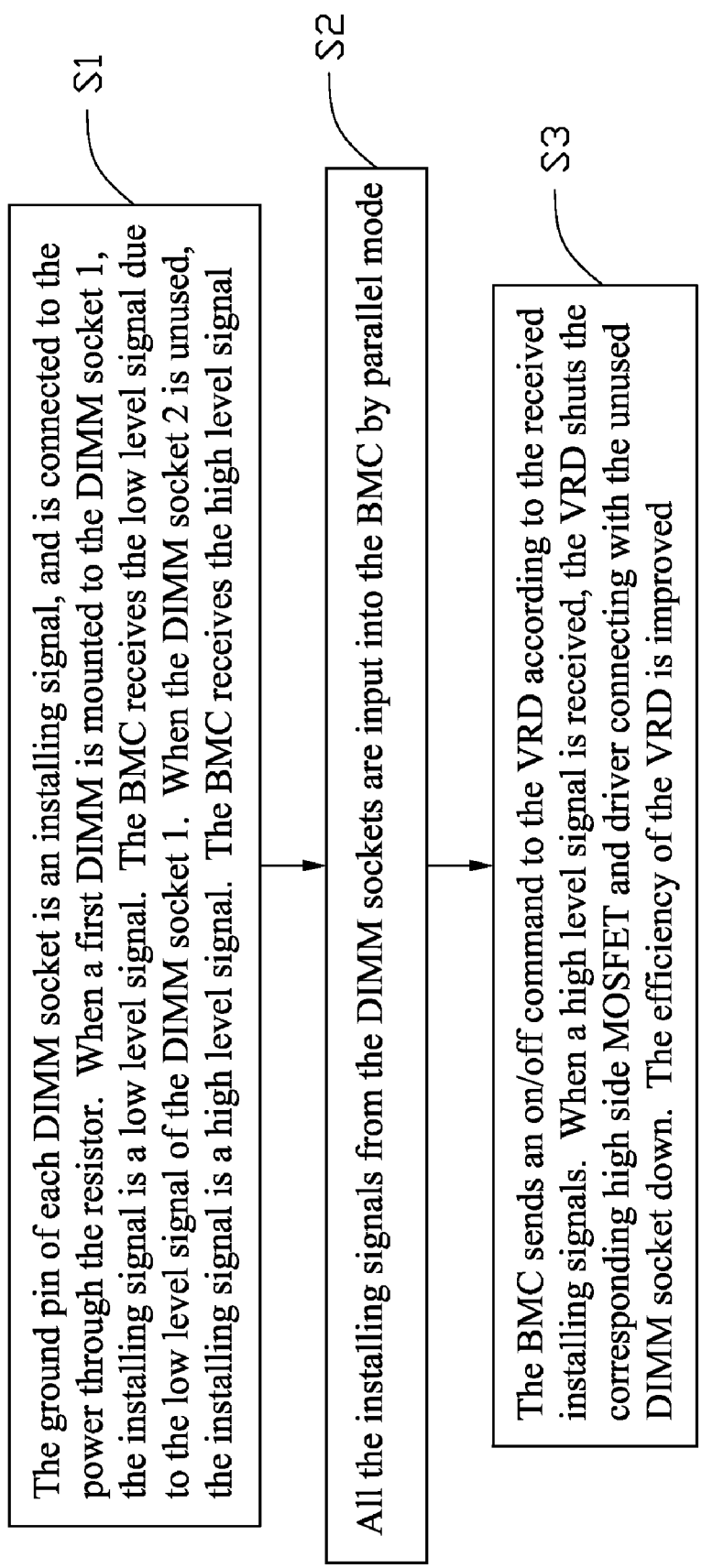
FIG. 2 is a flow chart of a method of improving memory power efficiency according to the exemplary embodiment.

Referring to FIG. 2, the method of improving memory power efficiency includes the following steps:

S1: the ground pin of each DIMM socket is an installing signal, and is connected to the power through the resistor. When a first DIMM is mounted to the DIMM socket 1, the installing signal is a low level signal. The BMC receives the low level signal due to the low level signal of the DIMM socket 1. When the DIMM socket 2 is unused, the installing signal is a high level signal. The BMC receives the high level signal.

S2: All the installing signals from the DIMM sockets are input into the BMC by parallel mode (or by a serial to parallel converter).

S3: the BMC sends an on/off command to the VRD according to the received installing signals. When a high level signal is received, the VRD shuts the corresponding high side MOSFET and driver connecting with the unused DIMM socket down. The efficiency of the VRD is improved.

The VRD efficiency varies with the load of the electrical current of the DIMMs output. If any unused DIMM sockets are powered on, the load of electrical current of the total DIMMs will become low and the VRD efficiency is low. If all the powered DIMM sockets are used, the load of electrical current of the DIMMs output is full and the VRD efficiency is good. Thus, when the BMC receives the installing signals, the BMC sends the command to the VRD to tell the VRD to shut the corresponding high side MOSFETs of the unused DIMM socket. Thus, the VRD efficiency is good.

A south bridge chip can replace the BMC. A low side MOSFET and a driver can replace the high side MOSFET and the driver. A system management bus can replace the I2C bus.

It is to be understood, however, that even though numerous characteristics and advantages of the disclosure have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A method comprising:
   a ground pin of a memory socket connected to a power source via a resistor, the ground pin is connected to a controller;
   the ground pin outputting a high level signal to the controller when the memory socket is without a memory component; and
   the controller sending an off-command to a regulator to cut off a supplying power to the memory socket after the controller receives the high level signal.

2. The method of claim 1, wherein the ground pin outputs a low level signal to the controller when the memory socket contains the memory component.

3. The method of claim 2, wherein the controller sends an on-command to the regulator to power to the memory socket after the controller receives the low level signal.

4. The method of claim 1, wherein the controller sends the off-command to the regulator through an Inter-Integrated Circuit (I2C) bus.

5. The method of claim 1, wherein the controller sends the off-command to the regulator through a system management bus.

6. The method of claim 1, wherein a switch is connected between the regulator and the memory socket, and the regulator is configured to cut off the supplying power by the switch.

7. The method of claim 6, wherein the switch is a Metal-Oxide-Semiconductor Field-Effect Transistor (MOSFET) and a driver.

8. The method of claim 7, wherein the MOSFET is a high side MOSFET.

9. The method of claim 7, wherein the MOSFET is a low side MOSFET.

10. The method of claim 6, wherein a choke is connected the switch with the memory socket.

11. The method of claim 6, wherein a choke is connected between the switch and the memory socket.

12. A system of improving memory power efficiency comprising:
   a memory socket having a ground pin connecting to a power voltage through a resistor;

a baseboard management controller (BMC) connected to the ground pin, wherein the BMC receives a low level signal from the ground pin when a memory component is mounted in the memory socket and the BMC receives a high level signal from the ground pin when the memory socket is unused; and a voltage regulator down (VRD) is connected to the BMC to supply power to the memory socket depending on an on command of the BMC after the BMC receives the low level signal; and the VRD does not supply power to the memory socket when the BMC receives the high level signal.

13. The system of improving memory power efficiency of claim 12, wherein the BMC sends the on command to the VRD through an Inter-Integrated Circuit (I2C) bus.

14. The system of improving memory power efficiency of claim 12, wherein the BMC sends the on command to the VRD through a system management bus.

15. The system of improving memory power efficiency of claim 12, wherein a switch connects between the VRD and the memory socket, the VRD does not supply power to the memory socket by controlling the switch.

16. The system of improving memory power efficiency of claim 15, wherein the switch is a Metal-Oxide-Semiconductor Field-Effect Transistor (MOSFET) and a driver.

17. The system of improving memory power efficiency of claim 16, wherein the MOSFET is a high side MOSFET.

18. The system of improving memory power efficiency of claim 16, wherein the MOSFET is a low side MOSFET.

19. The system of improving memory power efficiency of claim 15, wherein a choke is connected the switch with the memory socket.

20. The system of improving memory power efficiency of claim 15, wherein a choke is connected between the switch and the memory socket.

* * * * *